(12) United States Patent
Hung et al.

(10) Patent No.: US 6,366,519 B1
(45) Date of Patent: Apr. 2, 2002

(54) REGULATED REFERENCE VOLTAGE CIRCUIT FOR FLASH MEMORY DEVICE AND OTHER INTEGRATED CIRCUIT APPLICATIONS

(75) Inventors: Chun-Hsiung Hung, Hsinchu (TW); Tien-Ler Lin, Saratoga, CA (US); Kota Soejima, Kawasaki; Satoshi Matsubara, Yokohama, both of (JP)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 08/624,389
(22) PCT Filed: Mar. 9, 1995
(86) PCT No.: PCT/US95/03103
§ 371 Date: Apr. 5, 1996
§ 102(e) Date: Apr. 5, 1996
(87) PCT Pub. No.: WO96/28877
PCT Pub. Date: Sep. 19, 1996
(51) Int. Cl.[7] .............................................. G11C 13/00
(52) U.S. Cl. ........................................ 365/226; 363/60
(58) Field of Search ..................... 363/59, 60; 323/312, 323/313; 327/536, 537, 540, 541; 365/226, 227, 228

(56) References Cited

U.S. PATENT DOCUMENTS 5,258,662 A   11/1993   Skovmand ............... 307/296.3
5,394,027 A    2/1995   Park ............................ 327/536
5,414,669 A    5/1995   Tedrow et al. ............... 365/226
5,422,586 A    6/1995   Tedrow et al. ............... 327/306
5,455,794 A  * 10/1995  Javanifard et al. ...... 365/185.18
5,553,030 A  *  9/1996   Tedrow et al. ............... 365/226
5,675,279 A   10/1997   Fujimoto et al.

FOREIGN PATENT DOCUMENTS

| JP | 1-290195 | 11/1989 |
| JP | 1-307097 | 12/1989 |
| JP | 4-268294 | 9/1992 |
| JP | 6-259979 | 9/1994 |
| JP | 6-311732 | 11/1994 |

* cited by examiner

Primary Examiner—Matthew Nguyen
(74) Attorney, Agent, or Firm—Mark A. Haynes; Haynes Beffel & Wolfeld LLP

(57) ABSTRACT

A charge pump circuit which generates an output voltage at a selected level, but variations in the current supplied to the charge pump are limited, and variations in the output current generated by the charge pump are limited. The charge pump circuit is coupled to a power supply which has a supply voltage which varies over a specified range. It includes a first charge pump that generates a reference voltage higher than the supply voltage in response to the supply voltage. A circuit, coupled to the first charge pump and responsive to the reference voltage generates a regulated supply voltage. A second charge pump generates a controlled output voltage in response to the regulated supply voltage. The regulated supply voltage is used by pump clock drivers and as a pump reference supply for the second charge pump.

33 Claims, 9 Drawing Sheets

REGULATED REFERENCE VOLTAGE CIRCUIT FOR FLASH MEMORY DEVICE AND OTHER INTEGRATED CIRCUIT APPLICATIONS

BACKGROUND OF THE INVENTION

1. Field of the Invention

The present invention relates to charge pump or other reference voltage circuitry, and more particularly to integrated circuits such as flash memory devices, which include a charge pump used to generate high voltages on the chip.

2. Description of Related Art

Integrated circuit power supplies are typically specified at 5 volts +/−10%. This supply voltage variation can have a large impact on the amount of current drawn by a circuit on the chip. Reference voltage circuits such as charge pumps are particularly susceptible to this variation in input voltages. The output current generated by a charge pump, and the current drawn by a charge pump may vary substantially as the power supply voltage varies from 4.5 to 5.5 volts.

Flash EEPROM devices are being designed which generate high voltages on chip for use in the erasing or programming cycles for the memory arrays. Some prior art systems rely on not only the 5 volt power supply, but an additional programming power supply of 12 volts which are specified to vary by +/−5%. Newer designs use only the 5 volt supply, and use charge pumps to develop the higher potentials and negative voltages used during the erase and program cycles. The 5 volt supply voltage variations of +/−10% and resulting fluctuations in current produced or drawn, however, can have a large impact on the performance of the erasing and programming cycles. For consistent programming and erase cycles, it is desirable to control the amount of current delivered by such circuits.

Therefore, it is desirable to provide a charge pump circuit with a controlled current consumption, and controlled output current generation, which operates in response to the standard 5 volt only supply.

SUMMARY OF THE INVENTION

Accordingly, the present invention provides a reference voltage circuit, like a voltage divider or a charge pump circuit which generates an output voltage at a selected level, but variations in the current supplied to the charge pump are controlled, and variations in the output current generated by the charge pump are controlled.

The input and output currents are controlled by a regulating circuit which is coupled to the 5 volt only power supply. The regulating circuit generates a regulated supply voltage in response to the 5 volt only supply. Thus, the regulated supply voltage varies by less than the 5 volt only supply as the supply voltage varies over the specified range. The charge pump is coupled to the regulating circuit, and generates the output voltage in response to the regulated supply voltage. The variations in the current supplied to and supplied by, the charge pump, according to this circuit, are substantially reduced over an unregulated charge pump.

The regulated supply voltage is generated according to one aspect of the invention by an MOS transistor having its drain coupled to the power supply, and its source supplying the regulated supply voltage. The gate of the transistor is coupled to a reference voltage, which is slightly higher than the supply voltage. The reference voltage in one embodiment is generated by a regulator charge pump on the same integrated circuit as the charge pump being regulated.

According to another aspect of the invention, not only is the driver voltage for the charge pump regulated, but also the clocks used in the charge pump are generated using regulated drivers.

The invention can also be characterized as a flash EEPROM integrated circuit which is coupled to a power supply, such as a 5 volt only system, in which the power supply is specified to vary over +/−10%. This integrated circuit includes a flash EEPROM array, and a read, program and erase controller coupled to the array. A voltage generating circuit supplies a high potential to the array for program or erase operations, depending on the particular charge states of the cells which are selected as the programmed and erased states. The voltage generating circuit includes a regulating circuit, which generates the regulated supply voltage, such that it varies less than the supply voltage as the supply voltage varies over the specified range. Also, a charge pump is coupled to the regulating circuit, which generates a high positive voltage or negative voltage in response to the regulated supply voltage.

According to another aspect, the invention can be characterized as a charge pump circuit which has a controlled output current. This charge pump circuit is coupled to a power supply which has a supply voltage which varies over a specified range. It comprises a first charge pump that generates a reference voltage in response to the supply voltage. A circuit, coupled to the first charge pump and responsive to the reference voltage generates a regulated supply voltage. The second charge pump generates a controlled output voltage in response to the regulated supply voltage. This second charge pump produces an output current and variations in the output current generated by the second charge pump are limited by the regulated supply voltage.

Other aspects and advantages of the present invention can be seen upon review of the figures, the detailed description, and the claims which follow.

DETAILED DESCRIPTION OF PREFERRED EMBODIMENTS

Figure 1:
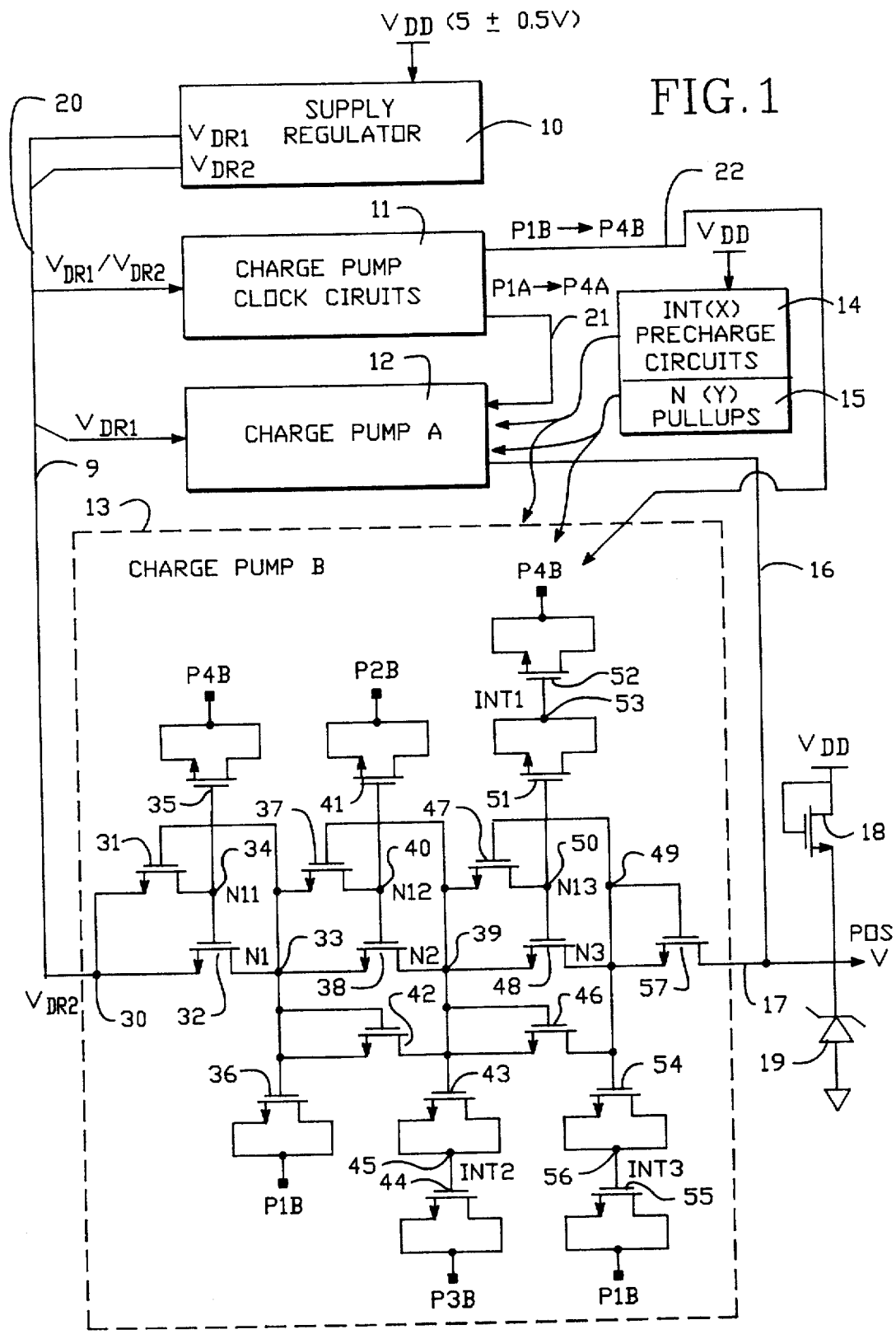
FIG. 1 is a diagram of a charge pump with a regulated supply according to the present invention.

A detailed description of a preferred embodiment of the present invention is provided with respect to FIGS. 1–12. FIG. 1 illustrates the basic positive voltage generator with a supply regulator for use in a flash EEPROM integrated circuit according to the present invention. This voltage generator includes a supply regulator 10 which is coupled to the 5 volt power supply $V_{DD}$. The 5 volt power supply is specified to vary over a range of 5 +/–0.5 volts. The circuit also includes charge pump clock driver circuits 11, a first multiple stage charge pump 12, labelled charge pump A, and a second multiple stage charge pump, labelled charge pump B. Charge pump B is illustrated at the transistor level for purposes of description of one example of the present invention. It will be recognized that charge pump A should have the same or similar design. Also shown in the figure are the internal precharge circuits 14 and internal pullup circuits 15 which are connected to labelled nodes on the charge pumps, as can be seen with reference to charge pump B. The positive program voltage on the outputs of the charge pumps are supplied on lines 16 and 17, respectively, and coupled to the voltage output keeper, which is composed of transistor 18 and diode 19.

The supply regulator 10 generates regulated supply voltages $V_{DR1}$ and $V_{DR2}$. These regulated supply voltages are supplied on line 20 to the charge pump clock circuits 11, charge pump A and charge pump B. Charge pump A is driven by supply voltage $V_{DR1}$, while charge pump B is driven by supply voltage $V_{DR2}$.

The charge pump clock circuits 11 generate the charge pump clocks labelled P1A through P4A on line 21 and P1B through P4B on line 22. The clock signals P1B through P4B are connected as illustrated in charge pump B.

The output diode 19 is formed by coupling an n-type buried diffusion region to line 17, the n-type buried diffusion region being formed in a p-well. The p-well is grounded. The junction between the n-type buried diffusion region and the p-well forms the diode 19, having a breakdown voltage of approximately 7 volts. The output transistor 18, in this example, has a width of 200 microns and a length of 1.2 microns.

Charge pump B receives as a reference supply input on line 9 the regulated supply voltage $V_{DR2}$ at node 30. Node 30 is coupled to the source of transistor 31 and to the source of transistor 32. The gate of transistor 31 is coupled to node 33. The drain of transistor 31 is coupled to node 34. The gate of transistor 32 is coupled to node 34 and the drain of transistor 32 is coupled to node 33. An MOS capacitor formed of transistor 35 has its gate coupled to node 34 and its source and drain coupled to the clock input P4B. An MOS capacitor formed by transistor 36 has its gate coupled to node 33 and its source and drain coupled to the clock input P1B.

The sources of transistors 37 and 38 are connected to node 33. The gate of transistor 37 and the drain of transistor 38 are coupled to node 39. The gate of transistor 38 and the drain of transistor 37 are coupled to node 40. The MOS capacitor formed by transistor 41 has its gate connected to node 40 and its source and drain coupled to the clock input P2B. Also, node 33 is coupled to the gate and source of transistor 42. The drain of transistor 42 is connected to node 39. Node 39 is also connected to the series MOS capacitors made up by transistors 43 and 44. Transistor 43 has its gate connected to node 39 and its source and drain connected to node 45. Transistor 44 has its gate coupled to node 45 and its source and drain connected to the clock input P3B.

Also, node 39 is connected to the gate and source of transistor 46 and to the sources of transistors 47 and 48. The gate of transistor 47 and the drain of transistor 48 are coupled to node 49. The gate of transistor 48 and the drain of transistor 47 are coupled to node 50. Also, the drain of transistor 46 is coupled to node 49. Node 50 is connected to series MOS capacitors made up by transistors 51 and 52. The gate of transistor 51 is connected to node 50. The source and drain of transistor 51 are connected to node 53. The gate of transistor 52 is connected to node 53. The source and drain of transistor 52 are connected to the clock input P4B. Node 49 is connected to the series MOS capacitors formed by transistors 54 and 55. Transistor 54 has its gate connected to node 49 and its source and drain connected to node 56. Transistor 55 has its gate connected to node 56 and its source and drain connected to the clock input P1B.

Node 49 is also connected to the gate and source of transistor 57. The drain of transistor 57 drives line 17 with the output of the charge pump B.

In this example, transistors 35, 41, 51, and 52 are native n-channel devices with have a width of 50 microns and a length of 15 microns. Transistors 31, 37, and 47 are native n-channel devices with a width of 20 microns and a length of 1.2 microns. Transistors 32, 38, 48, 42, and 46 are native n-channel devices with a width of 100 microns and a length of 1.2 microns. Transistors 36, 43, 54, 44, and 55 are native n-channel devices with a width of 300 microns and a length of 100 microns. The output transistor 57 is a native n-channel device with a width of 200 microns and a length of 1.2 microns. A "native" n-channel device does not have enhancement doping in the channel region, which is used to increase the p-type doping over the substrate levels in "normal" n-channel devices.

As mentioned above, there are pullup circuits in charge pump B, and similar pullup circuits in charge pump A, which are connected to the nodes 34, 33, 39, 40, 49, and 50. The nodes at which pullups are connected are labelled N1, N11, N2, N12, N3, and N13 in FIG. 1. Each of them consists of a transistor having its gate and source coupled to the supply voltage $V_{DD}$ and its drain connected to the node being pulled up. The size of these transistors in this example is 4 microns in width and 1.2 microns in length.

Also, precharge circuits are connected between the series MOS capacitors at nodes 53, 45 and 56, labelled INT1, INT2, and INT3. The precharge circuits can take the structure shown in FIG. 2 or FIG. 4.

Figure 2:
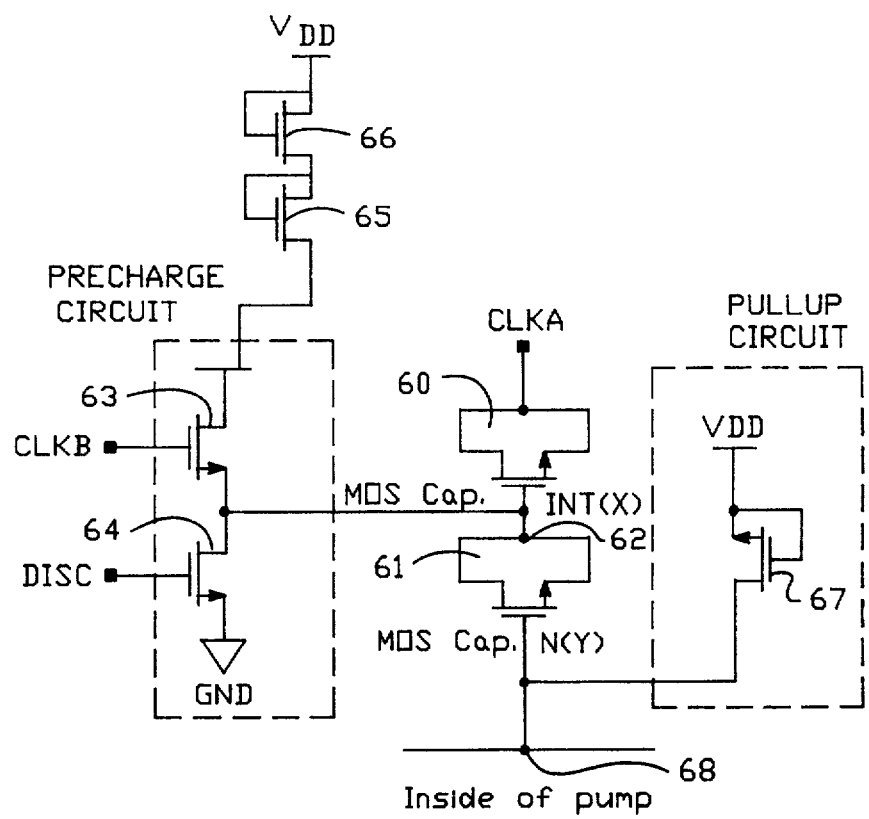
FIG. 2 illustrates the precharge circuit and pullup circuits which are used with the charge pump of FIG. 1.

As shown in FIG. 2, two MOS capacitors in series are shown, including MOS capacitor 60 and MOS capacitor 61. These capacitors may correspond, for example, to the capacitors formed by transistors 54 and 55 in FIG. 1. A precharge circuit is coupled to the node 62 as shown. The precharge circuit includes a first transistor 63 in series with a second transistor 64. The first transistor has its drain connected to the supply voltage through diode connected transistors 65 and 66. The source of transistor 63 is connected to node 62 and to the drain of transistor 64. Node 62 may correspond to node 56 (INT3) of FIG. 1. The source of transistor 64 is connected to ground. The gate of transistor 63 is connected to the signal labelled CLKB, which is a clock signal. The gate of transistor 64 is connected to a discharge signal labelled DISC.

Also shown in FIG. 2 is the pullup transistor 67 connected to the gate of the MOS capacitor 61. Thus, the gate of MOS capacitor 61 is connected to node 68 which has pullup circuit based on transistor 67 connected thereto. Node 68 may correspond to node (N3) in FIG. 1.

Figure 3:
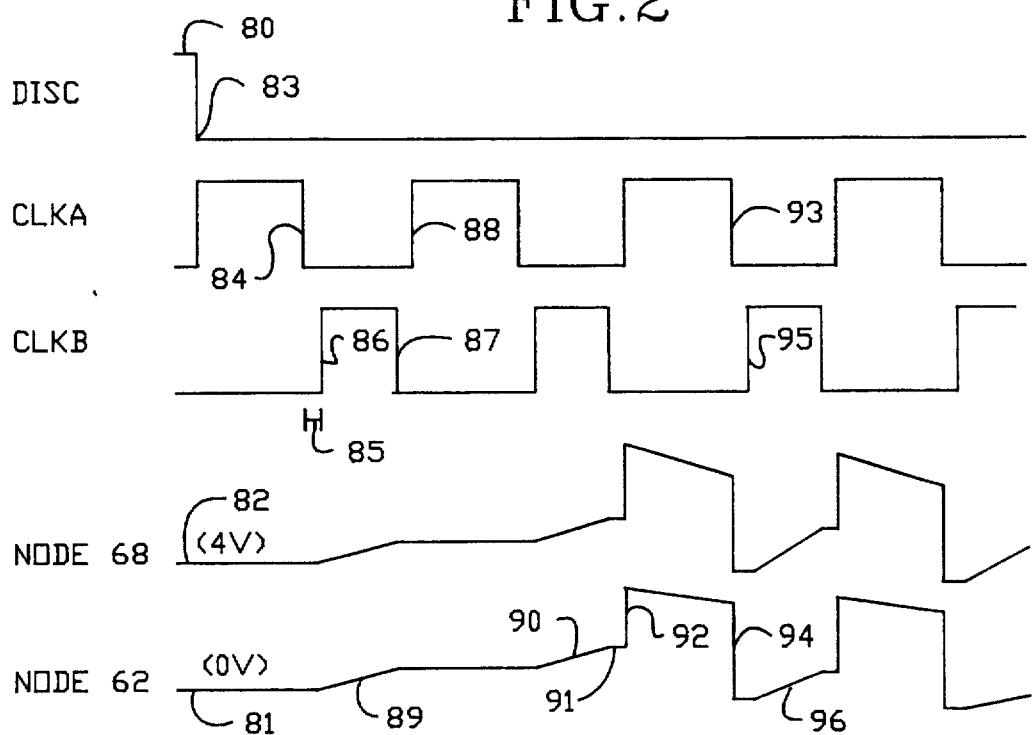
FIG. 3 includes timing diagrams used to illustrate the operation of the charge pump of FIG. 1.

With reference to FIG. 3, the operation of the precharge circuit is described. In particular, the signal DISC is initially high, as indicated at 80. When the signal DISC is high, transistor 64 keeps the node 62 grounded, nominally at zero volts, as shown at 81. The pullup circuit 67 keeps node 68 at approximately 4 volts, as illustrated at 82. When the circuit is enabled, the DISC signal drops low at point 83. The clock signal CLKA, which is coupled to the MOS capacitor 60 of FIG. 2, begins clocking the series capacitors, as illustrated. When node 62 is low, the MOS capacitor 60 is turned off. Thus, the first falling edge of clock A at 84 has substantially no effect on node 62 or node 68. After clock A falls at point 84, and a short interval indicated at 85, clock B rises at 86. Similarly, clock B falls at 87, a short time before clock A rises at 88. When clock B rises and clock A is low, node 81 will begin to charge up through transistor 63 as indicated at 89. Also, node 68 will follow node 62, because capacitor 61 is always on. When clock B falls and clock A is high, during the second cycle, node 62 is still not high enough to turn on capacitor 60. Thus, there is no pumping action. During the next cycle of clock B, node 62 increases further, as indicated at 90, with node 68 following. It reaches a level at 91 which is high enough to turn on MOS capacitor 60. At this point, when clock A rises, the pumping action occurs, driving node 62 up the same amount as clock A goes up, as indicated at 92. When clock A falls at 93, node 62 drops, as indicated at 94. When clock B rises, as indicated at 95, node 62 will charge up, as indicated at 96, maintaining a level sufficient to keep the MOS capacitor 60 on during pump operation.

Figure 4:
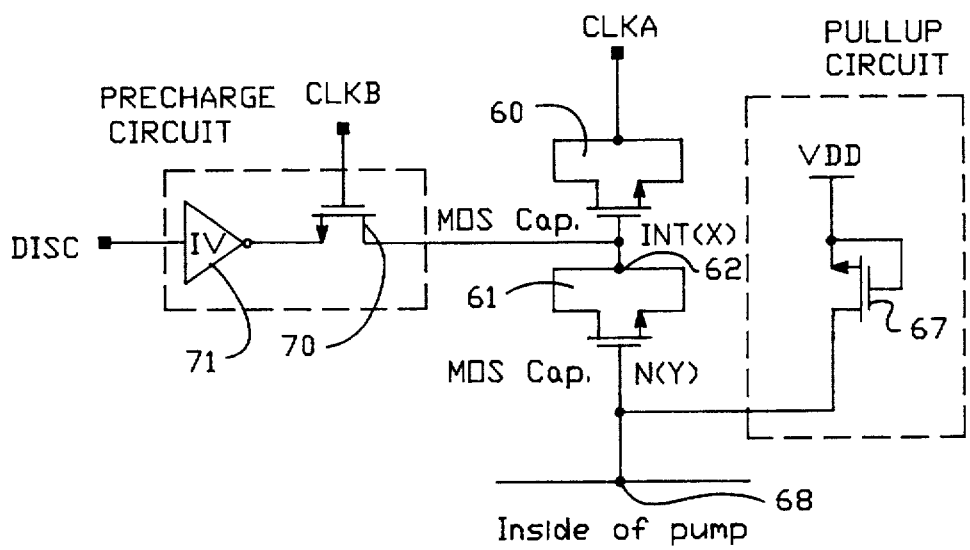
FIG. 4 is a diagram showing an alternative design for the precharge circuit used in the charge pump of FIG. 1.

FIG. 4 illustrates an alternative precharge circuit for the charge pump of FIG. 1. FIG. 4 has components similar to those in FIG. 2 and uses like reference numbers for like components. It differs in that the precharge circuit is made up of transistor 70 and inverter 71. In this embodiment, the transistor has its drain connected to node 62, its gate connected to the signal CLKB, and its source connected to the output of inverter 71. The input of inverter 71 is connected to the DISC signal. This circuit works in a substantially similar way as that in FIG. 2, except that the signal CLKB must be high when the circuit is not working to pull down the node 62.

The clock signals CLKA and CLKB should not overlap in the embodiments of FIGS. 2 and 4. If they did, the top transistor 60 might turn on in the early cycles after the signal CLKA is high, resulting in a negative pump on the next falling edge of CLKA. This may cause harm to the n-channel devices used as the capacitors in this circuit.

Figures 5A, 5B:
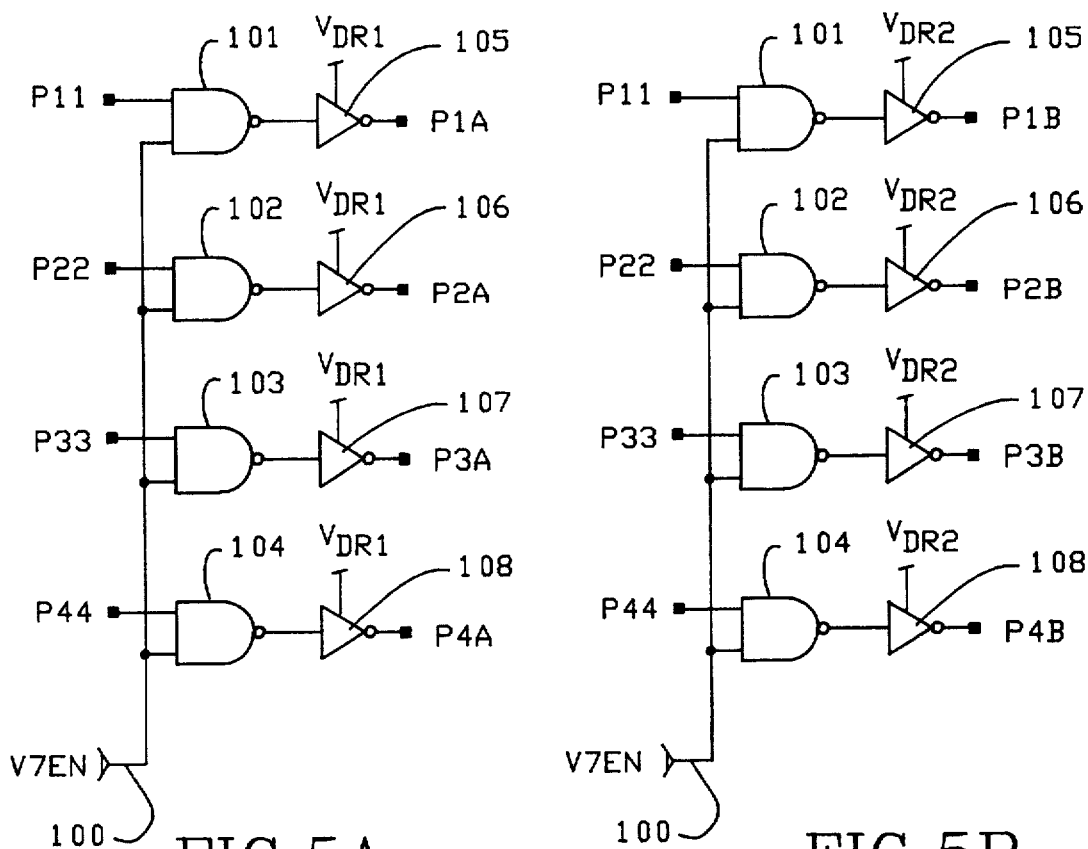
FIGS. 5A and 5B illustrate clock drivers for the charge pumps of FIG. 1.

FIGS. 5A and 5B illustrate the charge pump clock circuits which may be used in the circuit of FIG. 1. The same reference numbers are used for like components in FIGS. 5A and 5B, with the exception of the output signals and the supply voltages, as explained below. FIG. 5A provides the clock signals P1A through P4A, and FIG. 5B illustrates the circuits generating clock signals P1B through P4B. As can be seen, the circuits are substantially similar. Each includes an enable input, V7EN on line 100. Clock timing signals P11, P22, P33, and P44 are supplied as inputs to NAND gates 101, 102, 103, and 104, the second input to the NAND gates being the enable signal on line 100. The outputs of the NAND gates 101 through 104 are supplied through respective inverters 105, 106, 107, 108. The inverters are driven by the regulated supply voltage $V_{DR1}$, for the clock drivers in FIG. 5A, and $V_{DR2}$ for the clock drivers in FIG. 5B. The outputs of the respective inverters are the clock signals P1A through P4A and P1B through P4B, respectively.

In one example, the inverters are composed of a p-channel transistor in series with an n-channel transistor. The p-channel transistor for the inverter 105 has a width of 45 microns and a length of 0.8 microns. The n-channel for inverter 105 has a width of 26 microns and a length of 0.8 microns. The p-channel for inverter 106 has a width of 7 microns and a length of 0.8 microns while the n-channel has a width of 4 microns and a length of 0.8 microns. For inverter 107, the p-channel has a width of 98 microns and a length of 0.8 microns and the n-channel has a width of 52 microns and a length of 0.8 microns. For inverter 108, the p-channel has a width of 7 microns and a length of 0.8 microns, and the n-channel has a width of 4 microns and a length of 0.8 microns.

Figure 6:
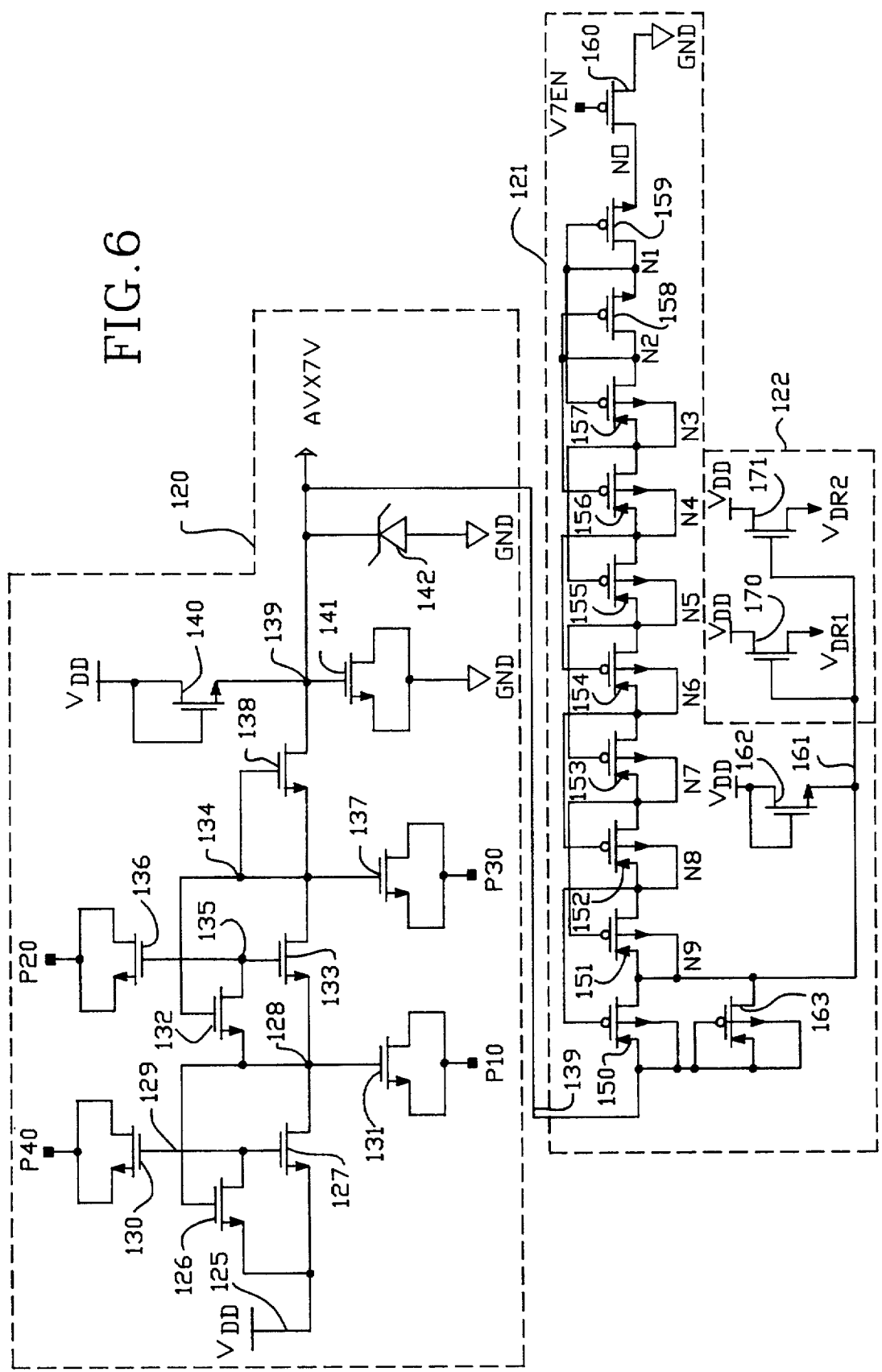
FIG. 6 is a circuit diagram of the voltage regulator used with the charge pump of FIG. 1.

FIG. 6 illustrates the regulator circuit used to generate the voltages $V_{DR1}$ and $V_{DR2}$ for the circuit of FIG. 1. In this embodiment, the regulator includes a charge pump, generally 120, and a voltage divider, generally 121. The voltage divider 121 supplies a reference voltage slightly higher than the 5 volts supply $V_{DD}$, for regulating transistors, generally 122.

The charge pump, generally 120, is supplied by the supply voltage $V_{DD}$ on line 125 and is made of native n-channel devices connected as follows. Line 125 is connected as follows to the source of transistors 126 and 127. The gate of transistor 126 and the drain of transistor 127 are coupled to node 128. The gate of transistor 127 and the drain of transistor 126 are coupled to node 129. Node 129 is connected through MOS capacitor made of transistor 130 to the clock P4G. Thus, transistor 130 has its gate connected to node 129 and its source and drain connected to the signal P4G. Also, MOS capacitor made transistor 131 has its gate connected to node 128 and its source and drain connected to the clock signal P1G. Node 128 is also connected to the sources of transistors 132 and 133. The gate of transistor 132 and the drain of transistor 133 are coupled to node 134. The gate of transistor 133 and the drain of transistor 132 are coupled to node 135. Node 135 is connected to the gate of capacitor connected transistor 136, which has its source and drain coupled to the clock signal P2G. Also, node 134 is connected to the gate of transistor 137 which is connected as a capacitor with its source and drain coupled to the clock signal P3G. Node 134 is coupled to the source and gate of transistor 138 which has its drain connected to node 139. Node 139 is connected to the source of transistor 140 which has its gate and drain connected to the supply voltage $V_{DD}$. Node 139 is also connected to the gate of capacitor connected transistor 141 which has its source and drain connected to ground. Also, node 139 is connected to the cathode of diode 142 which has its anode connected to ground. Diode 142 is formed by an n-channel buried diffusion region, which is coupled to node 139 and formed within a p-well. The p-well is coupled to ground providing the anode of the diode. Thus, node 139 provides an output voltage AVX7V of approximately 7 volts.

The output of the charge pump on line 139 is connected to the voltage divider 121. The voltage divider 121 is formed primarily of a sequence of diode connected p-channel transistors which are formed in n-wells. The p-channel transistors include a first native transistor 150 which has its source connected to line 139 and its drain connected to node N9.

P-channel transistors 151 through 157 are connected in series, and the n-well and source of each transistor connected to the preceding node. For instance, transistor 151 has its n-well and source coupled to node N9. The drain of each transistor is coupled to the succeeding node. For instance, transistor 151 has its drain connected to node N8. The gate of each transistor is coupled to the next succeeding node. For instance, transistor 151 has its gate connected to node N7, and the gate of transistor 150 is coupled to node N8.

The drain of transistor 157 is coupled to node N2. Native n-channel transistor 158 has its gate and drain coupled to node N2, and its source coupled to node N1. A native n-channel transistor 159 has its drain coupled to node N1 and its source coupled to node N0. The gate of transistor 159 is coupled to node NI. N-channel tansistor 160 has its drain coupled to node N0 and its source coupled to ground. The gate of transistor 160 is coupled to the control signal V7EN. When the signal V7EN on the gate of transistor 160 is on, a reference voltage is generated at node N9 and supplied on line 161. Also coupled to line 161 is a native n-channel transistor 162 having its source connected to line 161, and its gate and drain coupled to the supply $V_{DD}$. A p-channel transistor 163 is also coupled at its drain to line 161. The source of transistor 163 is coupled to line 139. Also, the gate of transistor 163 is coupled to line 139. Similarly, the n-well of transistor 163 is coupled back to line 139. This configuration of the voltage divider generates a voltage of about 6.3 volts on line 161 and can be readily adapted to provide a variety of reference potentials, such as 5.9 volts, higher than $V_{DD}$.

The reference voltage on line 161 has a value of about 6.3 volts, slightly higher than the supply voltage, and is used as a reference voltage for the regulator circuits 122. The regulator circuits in FIG. 6 are formed by n-channel transistors 170 and 171. The gate of transistor 170 is connected to node N9 on line 161 and its drain is connected to the supply voltage $V_{DD}$. The source of transistor 170 supplies the reference $V_{DR1}$. Similarly, the gate of transistor 171 is connected to the reference voltage on line 161, and its drain is connected to the supply voltage $V_{DD}$. The source of transistor 171 supplies the regulated supply $V_{DR2}$.

The transistors 170 and 171 tend to regulate the voltage at their source, such that it falls within a range of about 4.4 to 4.8 volts or about 4.6±0.2 volts. Transistors 170, 171, in one embodiment, are native devices with a width of approximately 500 microns and a length of about 1.2 microns, with a gate voltage of 5.9 volts. They may, alternatively, be implemented using normal MOS devices i.e. having an enhancement implant in the channel region, such as a 400 micron by 0.8 micron device with a higher gate potential, such as 6.3 volts. The supply voltage $V_{DR1}$, will be regulated at a value that is about equal to the reference voltage $V_{REF}$ on line 161, less the threshold voltage of the transistor. As the supply voltage $V_{DD}$ increases, the reference voltage $V_{DR1}$ tends to increase as well, but the threshold drop of the transistor also increases because of the n-channel body effect. This controls the variation of the supply voltage $V_{DR1}$ so that it varies much less than the specified range of the 5 volt +/−10% of $V_{DD}$.

Figure 7:
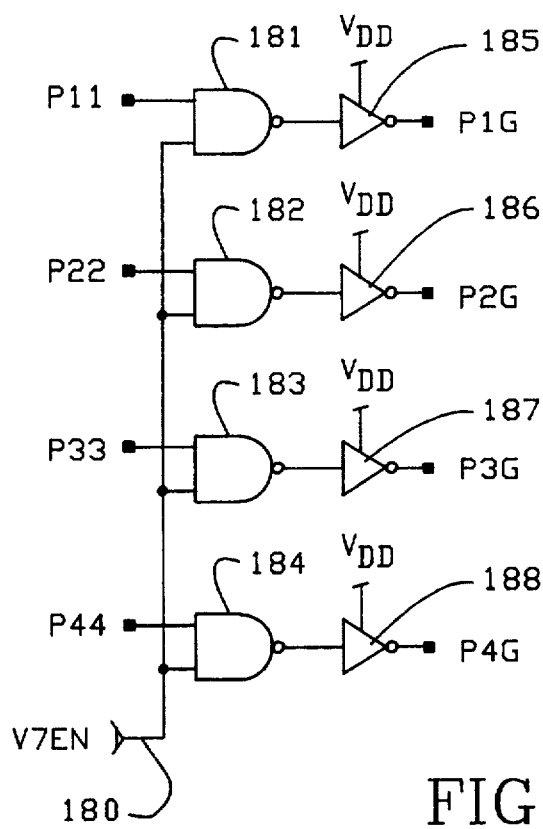
FIG. 7 is a schematic of the clock driver used with the voltage regulator of FIG. 6.

FIG. 7 illustrates the clock drivers for the charge pump 120 used in the regulator circuit shown in FIG. 6. These clock drivers are similar to those shown in FIGS. 5A and 5B, with the exception that the inverters are driven by $V_{DD}$, rather than the regulated supply voltages. Thus, these signals are enabled by the signal on line 180, which is coupled to the input of NAND gates 181 through 184. The clock signals P11, P22, P33, and P44 are coupled as the second inputs, respectively, to the NAND gates 181 through 184. The outputs of NAND gates 181 through 184 drive inverters 185 through 188. The output of the inverters drive the corresponding clock inputs on the charge pump 120. The charge pump 120 is designed to generate a 7 volt output with a DC current of less than 7 microamps through the voltage divider 121. Thus, it is relatively low current reference voltage generator used as a regulator for the higher current charge pumps used for the main functional circuitry of the integrated circuit.

Figure 8:
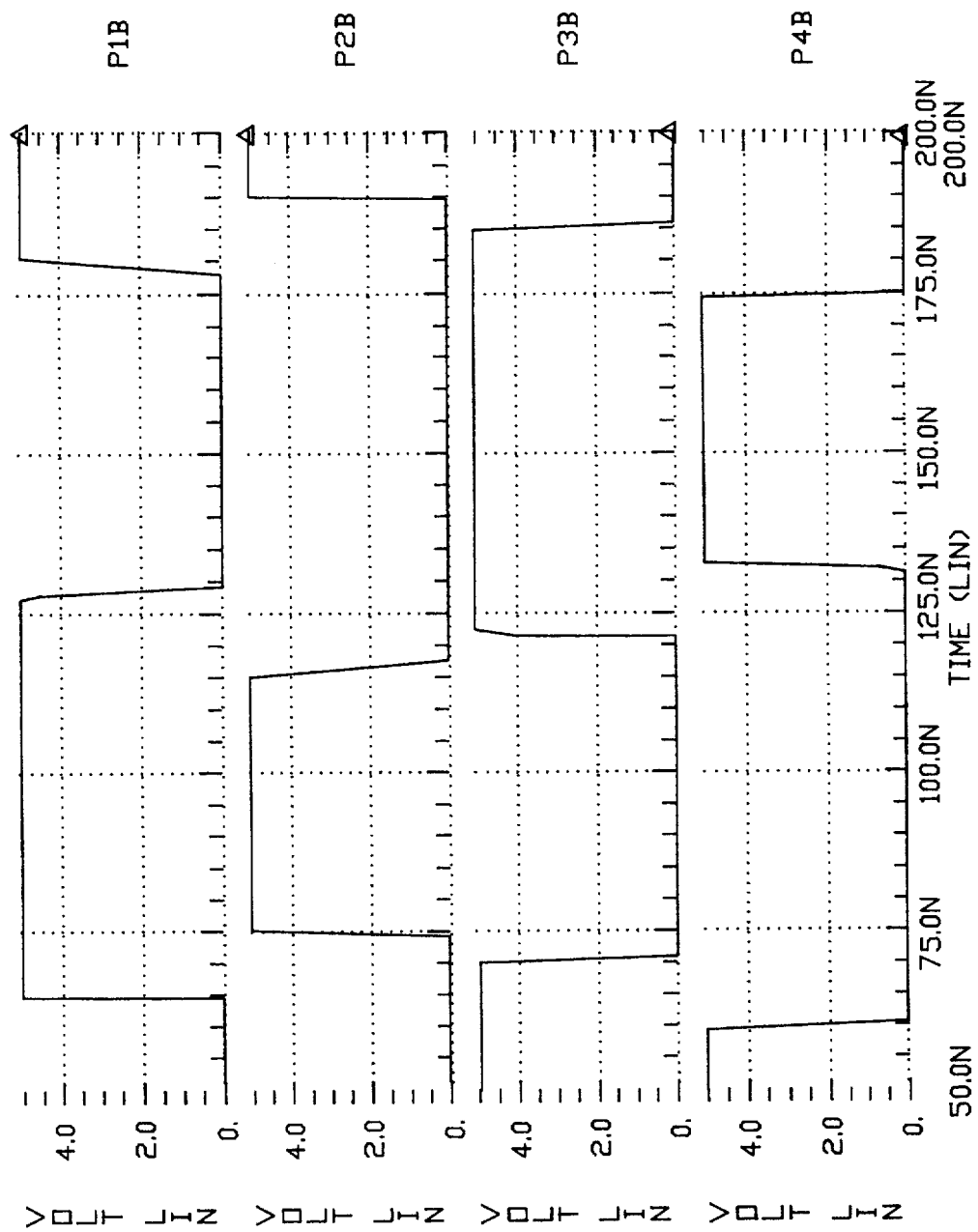
FIG. 8 is a timing diagram for the four phase clock signals generated by the circuits of FIG. 7.

FIG. 8 is the timing diagram for the four phase clocks used to drive the four phase charge pump shown in FIG. 1. The diagram includes traces for the clock signal P1B, P2B, P3B and P4B. The timing of the transitions of the clock signals controls the operation of the charge pump as will be appreciated by those a skill of the art. Peek magnitude of each of the pulses of the clock are regulated by regulated drivers as illustrated in FIGS. 5A and 5B. Similar four phase clocks can be used for the charge pump shown in FIG. 6.

Figure 9:
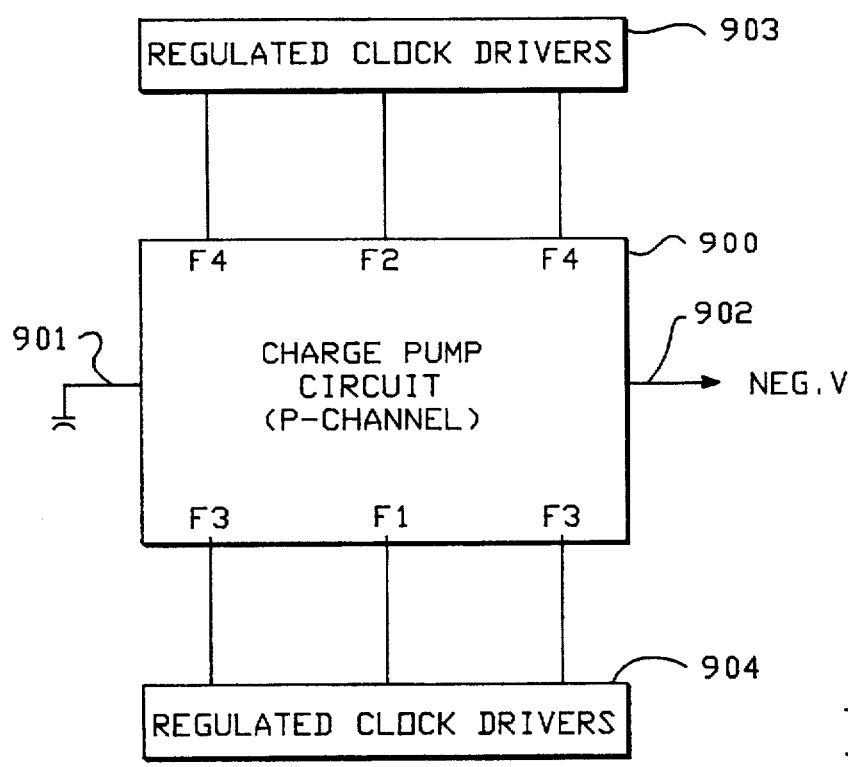
FIG. 9 is a block diagram of a negative voltage charge pump with regulated clock drivers according to the present invention.

FIG. 9 provides a schematic diagram of a negative voltage charge pump based on regulated supply voltages according to the present invention. In a figure, block 900 represents a charge pump circuit such as the charge pump circuit in block 13 of FIG. 1. However, to generate a negative voltage, the supply input 901, which corresponds to line 9 of FIG. 1, is connected to ground for negative charge pump circuit 900. The clock signals F1 through F4 are connected to similar charge pump circuits in a four-phase relationship, like block 13 of FIG. 1, except that the transistors used to implement the charge pump are p-channel, rather than n-channel. This causes the charge pump to generate a negative voltage on output 902. The four-phase clock signals have a timing relationship such as that shown in FIG. 8 to generate the negative voltage. In the embodiment of FIG. 9, the clock signals are generated by the regulated clock drivers 903 and 904, which are implemented as shown in FIG. 5A and 5B. The clock signals F1 though F4 correspond to the clock signals P1B through P4B is in a positive charge pump embodiment.

Figure 10:
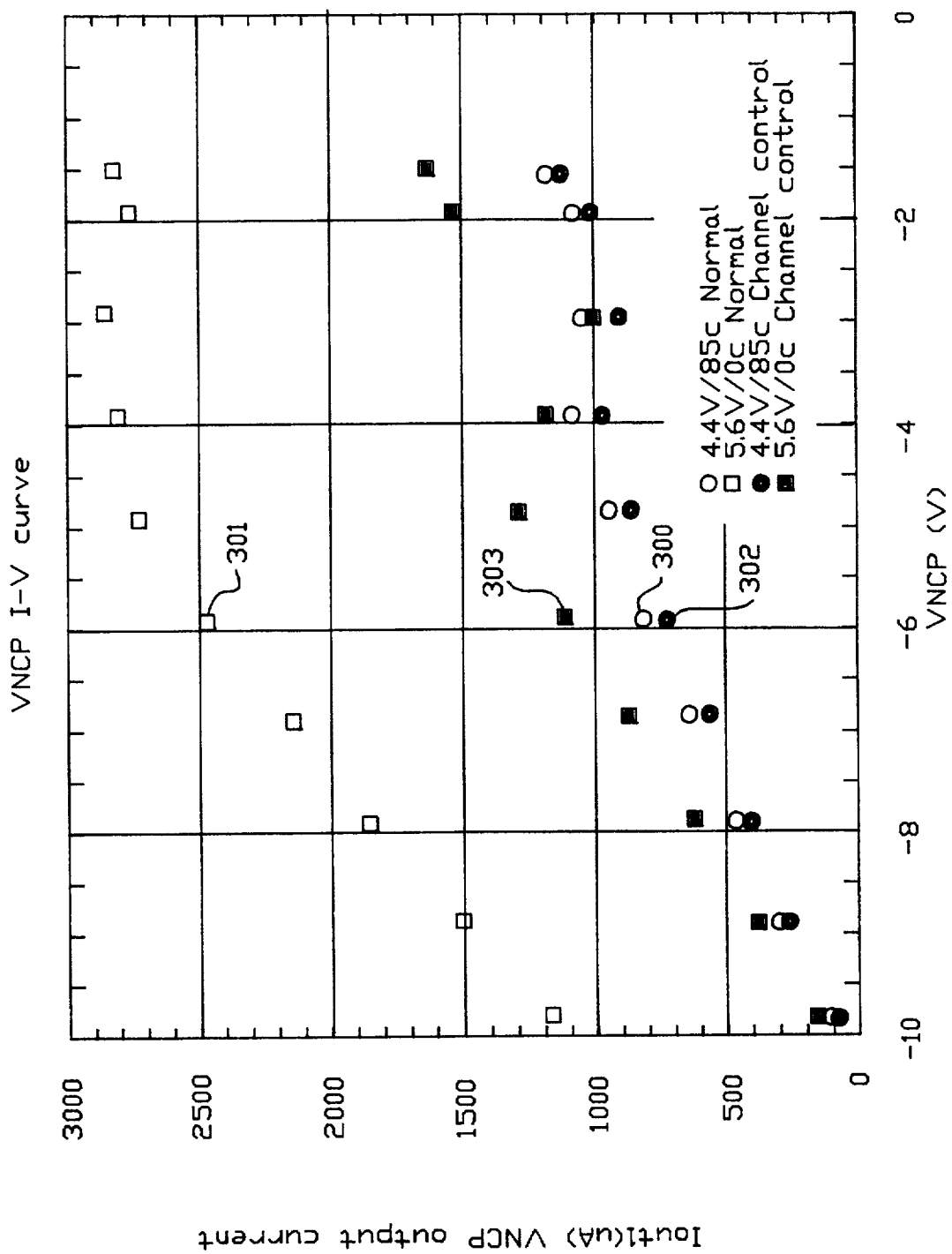
FIG. 10 is a simulation graph illustrating the output current versus output voltage of the negative charge pump of FIG. 9 as the supply voltage varies over its specified range, with and without the regulator.
Figure 11:
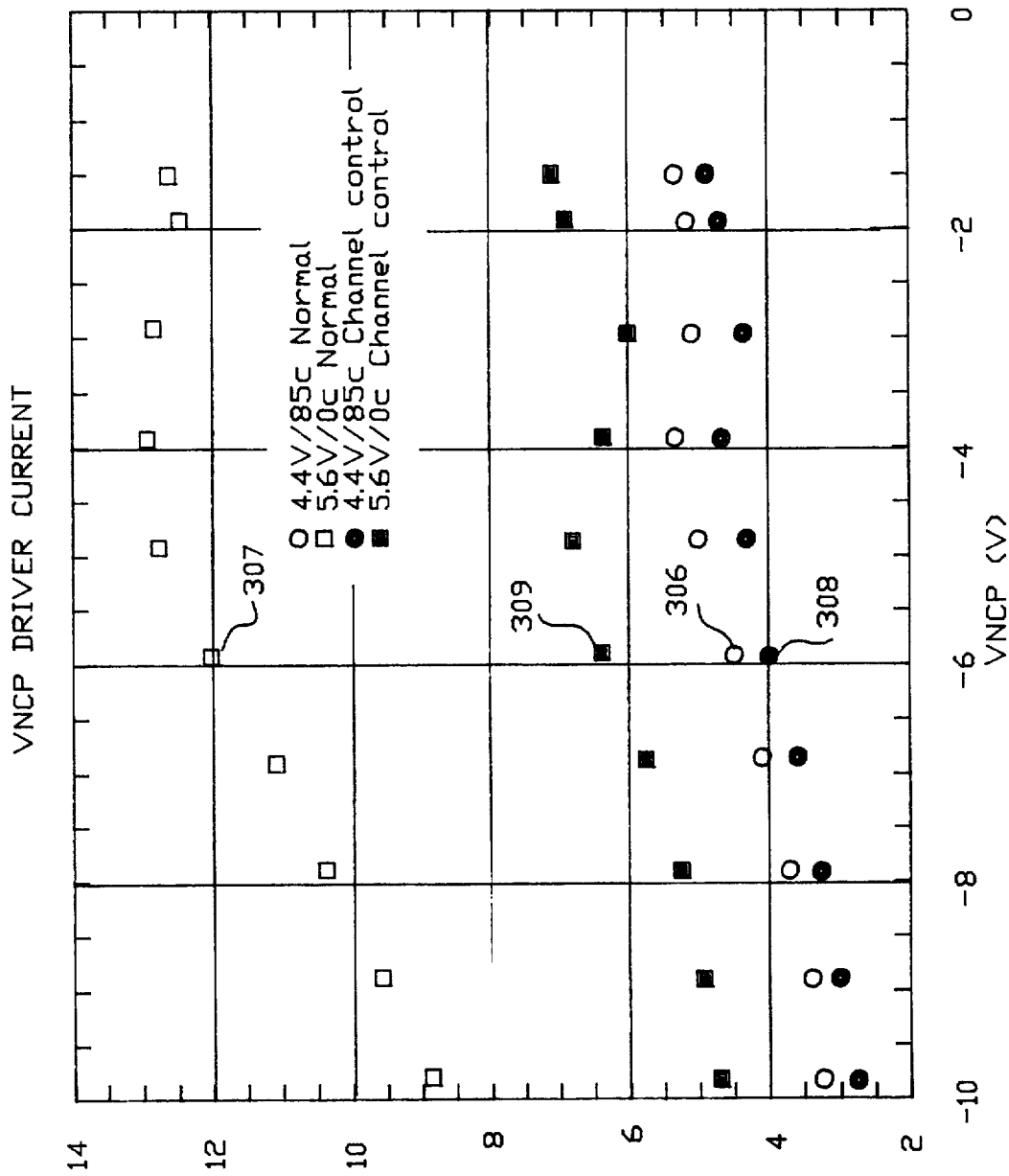
FIG. 11 is a simulation graph showing the input driver current for the charge pump clock driver of FIG. 9 for specified output voltages as the supply voltage varies over its specified range, with and without the regulator.

FIGS. 10 and 11 illustrate the improvement in performance provided by regulated charge pump for negative output voltage of the present invention. In FIG. 10, the output voltage of the charge pump versus the output current of the charge pump is plotted for four conditions. The first two conditions represented by the open circle and the open square, respectively, are 5.6 volt supply at zero degrees Centigrade, and a 4.4 volt supply at 85 degrees Centigrade, representing the unregulated supply voltage variations in output current for over the specified range of the input supply. Thus, at negative 6 volts charge pump output voltage, the output current with a 4A volt supply at 85 degrees Centigrade is represented by coordinate 300 at about 800 microamps. For the same output voltage with a 5.6 volt supply at zero degrees Centigrade, the output current is shown by coordinate 301 at approximately 2500 microamps. Thus, the variation in output current for a specified output voltage for the charge pump circuitry of FIG. 1, varies from approximately 800 microamps to approximately 2500 microamps, or a range of over 3:1. With the regulated charge pump, according to the present invention, the plots are shown in the closed circles and closed squares for 4.4 volts at 85 degrees Centigrade and 5.6 volts at zero degrees Centigrade, respectively. As can be seen, at negative 6 volts output, coordinate 302 shows the 4.4 volt condition. This condition generates an output current of about 750 microamps. Coordinate 303 shows the output current at negative 6 volts for 5.6 volt supply current at zero degrees Centigrade with the regulated charge pump. As can be seen, this value is just over 1100 microamps.

FIG. 11 shows the variation in current drawn by the charge pump clock driver over the same conditions with the open circle and square corresponding to the unregulated charge pump clock driver 4.4 volt and 5.6 volt conditions, respectively, and the closed circle and square corresponding to the regulated charge pump clock driver 4.4 volt and 5.6 volt conditions, respectively. As can be seen, at negative 6 volts, the unregulated supply the charge pump clock driver will draw approximately 4.5 milliamps, as illustrated by coordinate 306. At 5.6 volts, the unregulated supply, the charge pump clock driver will draw approximately 12 milliamps, as illustrated at coordinate 307. With the regulated supply, the current drawn by the charge pump clock driver at the low range of 4.4 volts is illustrated at coordinate 308, and is about 4 milliamps. In the high voltage condition of the supply at 5.6, the regulated charge pump clock driver draws about 7 milliamps, as illustrated at coordinate 309. Thus, it can be seen that, in the unregulated condition, the current drawn by the charge pump clock driver with a negative 6 volt output varies over a range of about 4.5 to 12 milliamps, while with the regulated voltage on the charge pump clock driver, the current varies from 4 to 6.5. This is a substantial improvement in performance for the charge pump, according to the present invention. Further improved control over the fluctuation of currents in the charge pump clock driver can be gained by precise control of pump clock frequency.

Figure 12:
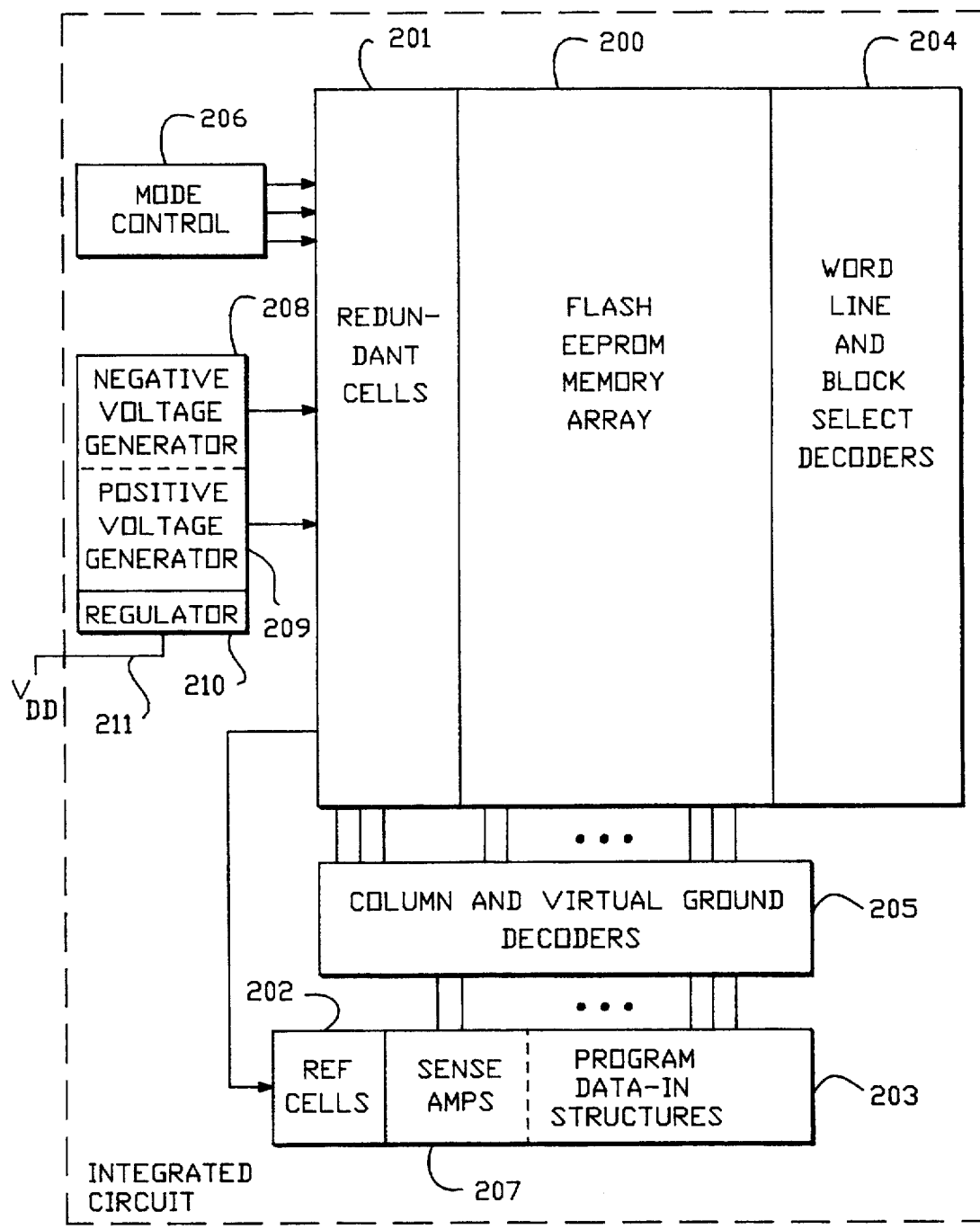
FIG. 12 is a heuristic block diagram of a flash EEPROM integrated circuit having the regulated positive and negative voltage generators of the present invention.

FIG. 12 illustrates a preferred application of the regulated charge pump of the present invention. In particular, an integrated circuit flash EEPROM device is illustrated. Thus, the integrated circuit of FIG. 12 includes a flash EEPROM memory array 200 coupled to a plurality of redundant memory cells 201 used for replacing failed cells in the main array as known in the art. A plurality of reference cells 202 are used with sense amps 207 for differential sensing the state of the cells in the memory array.

Coupled to the memory array 200 are word line and block select decoders 204 for horizontal decoding in the memory array. Also coupled to the memory array 200 are the column decoder and virtual ground circuit 205 for vertical decoding in the array.

Coupled to the column decoder and virtual ground circuit 205 are the program data in structures 203. Thus, the sense amps 207 and the program data in structures 203 provide data in and out circuitry coupled to the memory array.

The flash EEPROM integrated circuitry typically is operated in a read only mode, a program mode, and an erase mode. Thus, mode control circuitry 206 is coupled to the array 200.

Finally, according to one embodiment of the present invention, during the program and erase modes, a high positive or a negative potential is applied to the gate, source and/or drain of the memory cells. Thus, a negative voltage generator 208 such as the charge pump of FIG. 9, and a positive voltage generator 209, such as the charge pump of FIG. 1, are used for supplying various reference voltages to the array. The negative and positive voltage generators 208 and 209 are driven by a regulator circuit 210 as described above, which is in turn supplied by the power supply voltage $V_{DD}$ on line 211, specified as 5 volts and varying over a range of +/−10%.

Accordingly, the present invention provides a charge pump mechanism for use with flash EEPROM devices which provides vastly improved performance characteristics for the purposes of low power operation, and for the purposes of consistent program and erase operations. The technique taught by the present invention suppresses the output current and the drive current variation as the supply voltage varies between 5.6 volts at zero degrees Centigrade and 4.4 volts at 85 degrees Centigrade. Further, it does not reduce the output current at the low end of the supply voltage, at 4.4 volts and 85 degrees Centigrade. The variation in currents is mainly due to the clock frequency differences of about 1.8 times.

While the above provides a full and complete disclosure of the invention, modifications, integrations, alternate implementations and constructions will naturally occur to those skilled in the art, without departing from the true spirit and scope of the invention. Therefore, the above description and illustrations should not be construed as limiting the scope of the invention which is defined in the following claims.

What is claimed is:

1. An integrated circuit coupled to a power supply having a supply voltage which may vary by a specified range, comprising:

a regulating circuit, coupled to the power supply, to generate a regulated supply voltage in response to the supply voltage, the regulating circuit controlling the regulated supply voltage such that it varies less than the supply voltage as the supply voltage varies over the specified range; and a reference voltage circuit, coupled to the regulating circuit, which generates an output voltage in response to the regulated supply voltage.

2. The integrated circuit of claim 1, wherein the reference voltage circuit draws a supply current, and variations in the supply current drawn by the reference voltage circuit are limited by the regulated supply voltage.

3. The integrated circuit of claim 1, wherein the reference voltage circuit generates an output current, and variations in the output current generated by the reference voltage circuit are limited by the regulated supply voltage.

4. The integrated circuit of claim 1, wherein the regulating circuit includes a regulator charge pump generating a first reference voltage, and a control circuit responsive to the reference voltage and the supply voltage to generate the regulated supply voltage.

5. The integrated circuit of claim 4, wherein the control circuit comprises a transistor having a drain coupled to the supply voltage, a gate coupled to the first reference voltage, and a source at which a regulated voltage is provided.

6. The integrated circuit of claim 5, wherein the first reference voltage is greater than the supply voltage.

7. The integrated circuit of claim 1, wherein the supply voltage is nominally 5 volts plus or minus 10%.

8. The integrated circuit of claim 1, wherein the reference voltage circuit comprises a charge pump including a pump reference supply and a pump clock driver and wherein the regulated supply voltage is coupled to the pump clock driver.

9. The integrated circuit of claim 1, wherein the reference voltage circuit comprises a charge pump including a pump reference input coupled to the regulated supply voltage.

10. The integrated circuit of claim 1, wherein the reference voltage circuit comprises a charge pump including a pump reference input, and a pump clock driver driving a pump clock for the charge pump, and the pump clock driver is coupled to the regulated supply voltage so that variations in the pump clock are limited.

11. The integrated circuit of claim 10, wherein the pump reference input is coupled to the regulated supply voltage.

12. The integrated circuit of claim 1, wherein the output voltage is negative.

13. The integrated circuit of claim 1, wherein the output voltage is positive.

14. A flash memory integrated circuit coupled to a power supply having a supply voltage which may vary by a specified range, comprising:

a floating gate memory array;

a read, program and erase controller coupled to the array; and a voltage generating circuit which supplies a program potential to the array for program or erase operations, including
   a regulating circuit, coupled to the power supply, to generate a regulated supply voltage in response to the supply voltage, the regulating circuit controlling the regulated supply voltage such that it varies less than the supply voltage as the supply voltage varies over the specified range; and
   charge pump circuitry, coupled to the regulating circuit, which generates program voltages in response to the regulated supply voltage.

15. The integrated circuit of claim 14, wherein the charge pump circuitry draws a supply current, and variations in the supply current drawn by the charge pump circuitry are limited by the regulated supply voltage.

16. The integrated circuit of claim 14, wherein the charge pump circuitry generates an output current, and variations in the output current generated by the charge pump circuitry are limited by the regulated supply voltage.

17. The integrated circuit of claim 14, wherein the regulating circuit includes a regulator charge pump generating a first reference voltage, and a control circuit responsive to the reference voltage and the supply voltage to generate the regulated supply voltage.

18. The integrated circuit of claim 17, wherein the control circuit comprises a transistor having a drain coupled to the supply voltage, a gate coupled to the first reference voltage, and a source at which a regulated voltage is provided.

19. The integrated circuit of claim 18, wherein the first reference voltage is greater than the supply voltage.

20. The integrated circuit of claim 14, wherein the supply voltage is nominally 5 volts plus or minus 10%.

21. The integrated circuit of claim 14, wherein the charge pump circuitry includes a pump reference input coupled to the regulated supply voltage.

22. The integrated circuit of claim 14, wherein the charge pump circuitry includes a pump reference input, and a pump clock driver driving a pump clock for the charge pump circuitry, and the pump clock driver is coupled to the regulated supply voltage so that variations in the pump clock are limited.

23. The integrated circuit of claim 22, wherein the pump reference input is coupled to the regulated supply voltage.

24. The integrated circuit of claim 14, wherein the charge pump circuitry includes a positive voltage charge pump coupled to the regulating circuit, which generates positive program voltages in response to the regulated supply voltages; and a negative voltage charge pump coupled to the regulating circuit, which generates negative program voltages in response to the regulated supply voltages.

25. A charge pump circuit having a controlled output current, coupled to a power supply having a supply voltage which may vary by a specified range, comprising:

a first charge pump which generates a reference voltage in response to the supply voltage;

a circuit responsive to the reference voltage and the supply voltage which generates a regulated supply voltage; and a second charge pump which generates a controlled output voltage in response to the regulated supply voltage, the second charge pump generating an output current, and variations in the output current generated by the charge pump are limited by the regulated supply voltage.

26. The charge pump circuit of claim 25, wherein the control circuit comprises a transistor having a drain coupled to the supply voltage, a gate coupled to the reference voltage, and a source at which a regulated voltage is provided.

27. The charge pump circuit of claim 26, wherein the reference voltage is greater than the supply voltage.

28. The charge pump circuit of claim 27, wherein the supply voltage is nominally 5 volts plus or minus 10%.

29. The charge pump circuit of claim 25, wherein the second charge pump includes a pump reference input coupled to the regulated supply voltage.

30. The charge pump circuit of claim 25, wherein the second charge pump includes a pump reference input, and a pump clock driver driving a pump clock for the second charge pump, and the pump clock driver is coupled to the regulated supply voltage so that variations in the pump clock are limited.

31. The charge pump circuit of claim 30, wherein the pump reference input is coupled to the regulated supply voltage.

32. The charge pump circuit of claim 25, wherein the controlled output voltage is negative.

33. The charge pump circuit of claim 25, wherein the controlled output voltage is positive.

* * * * *

Disclaimer

6,366,519—Chun-Hsiung Hung, Hsinch (TW); Tien-Ler Lin, Saratoga, CA; Kota Soejima, Kawasaki; Satoshi Matsubara, Yokohama, both of Japan. REGULATED REFERENCE VOLTAGE CIRCUIT FOR FLASH MEMORY DEVICE AND OTHER INTEGRATED CIRCUIT APPLICATIONS. Patent dated April 2, 2002. Disclaimer filed July 2, 2004, by the assignee Macronix International Co., Ltd.

This patent is subject to a terminal disclaimer.

*(Official Gazette, July 26, 2005)*